United States Patent [19]

Hecht et al.

[11] Patent Number: 5,451,131
[45] Date of Patent: Sep. 19, 1995

[54] DOCKABLE INTERFACE AIRLOCK BETWEEN PROCESS ENCLOSURE AND INTERPROCESS TRANSFER CONTAINER

[75] Inventors: Lewis C. Hecht, Vestal, N.Y.; Merritt P. Sulger, deceased, late of Brackney, Pa., by Ellen Sulger, executrix; Ernst E. Thiele, Endicott, N.Y.; Mark V. Pierson, Binghamton, N.Y.; Lawrence E. Williams, Binghamton, N.Y.

[73] Assignee: International Business Machines Corporation, Armonk, N.Y.

[21] Appl. No.: 901,041

[22] Filed: Jun. 19, 1992

[51] Int. Cl.6 .................. B65G 1/00; B65G 65/34; C23C 14/00; B23B 29/24
[52] U.S. Cl. .................. 414/217; 414/292; 118/50; 29/743
[58] Field of Search ............... 414/217, 225, 226, 292, 414/609-612, 586, 621, 622, 733, 729, 730, 935-941; 29/743, 744; 49/98, 103, 124, 130; 118/50, 50.1, 500, 503, 729-730; 11/11

[56] References Cited

U.S. PATENT DOCUMENTS

| | | | |
|---|---|---|---|
| 4,343,584 | 8/1982 | Hudgins | 414/222 |
| 4,532,970 | 8/1985 | Tullis et al. | 141/98 |
| 4,534,389 | 8/1985 | Tullis | 141/98 |
| 4,616,683 | 10/1986 | Tullis et al. | 141/98 |
| 4,636,128 | 1/1987 | Millis et al. | 414/217 |
| 4,674,936 | 6/1987 | Bonora | 414/217 |
| 4,674,939 | 6/1987 | Maney et al. | 414/292 |
| 4,676,709 | 6/1987 | Bonora et al. | 414/217 |
| 4,705,444 | 11/1987 | Tullis et al. | 414/226 |
| 4,724,874 | 2/1988 | Parikh et al. | 141/98 |
| 4,739,882 | 4/1988 | Parikh et al. | 206/454 |
| 4,781,511 | 11/1988 | Harada et al. | 414/217 |
| 4,802,809 | 2/1989 | Bonor et al. | 414/217 |
| 4,815,912 | 3/1989 | Maney et al. | 414/217 |
| 4,851,018 | 7/1989 | Lazzari et al. | 55/356 |
| 4,859,137 | 8/1989 | Bonora et al. | 414/648 |
| 4,875,825 | 10/1989 | Tullis et al. | 414/786 |
| 4,901,011 | 2/1990 | Koike et al. | 324/158 |
| 4,917,556 | 4/1990 | Stark et al. | 414/217 |
| 4,923,353 | 5/1990 | Tullis et al. | 414/226 |
| 4,963,069 | 10/1990 | Wurst et al. | 414/416 |
| 4,995,430 | 2/1991 | Bonora et al. | 141/98 |
| 5,100,276 | 3/1992 | Iwasaki et al. | 414/222 |
| 5,232,328 | 8/1993 | Owczarz et al. | 412/222 |

*Primary Examiner*—Margaret A. Focarino
*Assistant Examiner*—R. B. Johnson
*Attorney, Agent, or Firm*—Richard M. Goldman

[57] ABSTRACT

Disclosed is a manufacturing system having isolated islands of "clean room" environment connected by inter-process transfer containers for transfering in-process workpieces. The system has airlock transfer ports between the process enclosures and the inter-process transfer containers. The make and break airlock transfer ports have facing sealable doors in the process enclosure and the transfer container. These doors are in air sealable facing recesses of the process enclosure and the transfer container. At least one peripheral gasket surrounds the recesses and the pair of doors. This provides a substantially clean room environment in the airlock. The sealable door in the interprocess transfer container is fabricated of a ferromagnetic material and is seated on a ferromagnetic gasket, while the sealable door in the process enclosure has a controllable electromagnetic clamp. After establishment of an airtight seal between the two recesses, the doors are opened by activating the electromagnetic clamp in the process enclosure door to pull the ferromagnetic door in the interprocess transfer container away from the ferromagnetic gasket. The results in the simultaneous opening of the of the process enclosure door and the ferromagnetic interprocess transfer container door, while avoiding contamination inside either of the containers.

6 Claims, 9 Drawing Sheets

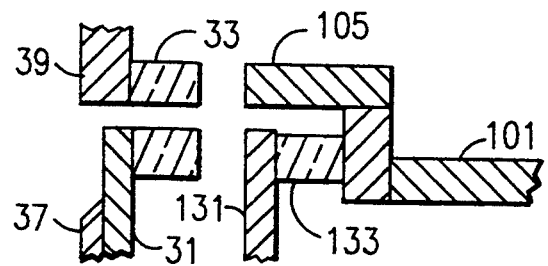
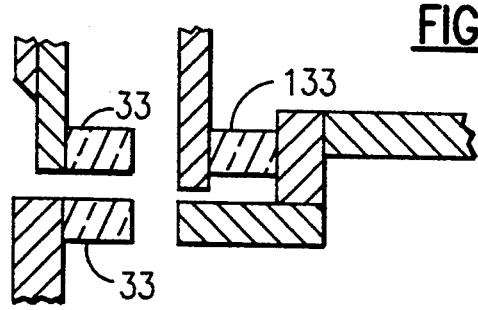
FIG.9A
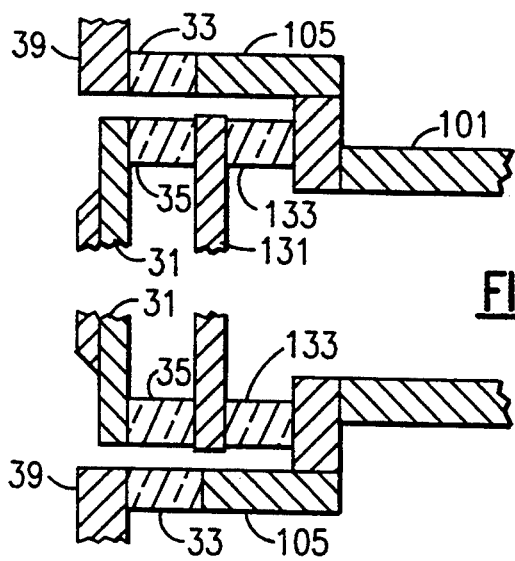
FIG.9B
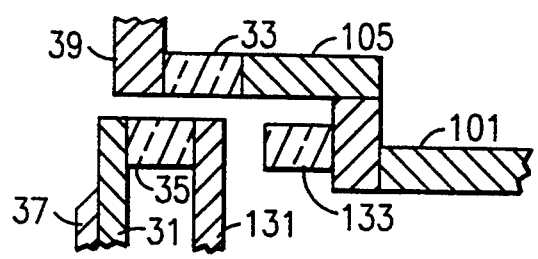
FIG.9C
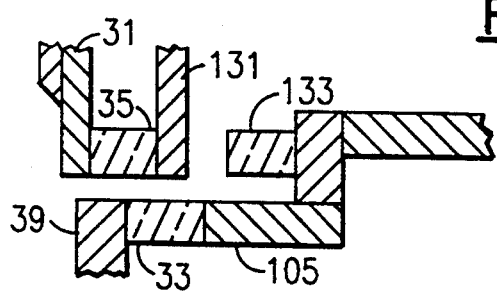

DOCKABLE INTERFACE AIRLOCK BETWEEN PROCESS ENCLOSURE AND INTERPROCESS TRANSFER CONTAINER

CROSS REFERENCE TO RELATED APPLICATIONS

This application is related to the following commonly assigned, copending applications of even filing date:

1. Attorney's docket number EN9-92-071, Ser. No. 07/901,640, filed Jun. 19, 1992 for VACUUM LOADING CHUCK AND FIXTURE FOR FLEXIBLE PRINTED CIRCUIT PANELS.
2. Attorney's docket number EN9-92-073, Ser. No. 07/901,042, filed Jun. 19, 1992 for METHOD OF PRINTED CIRCUIT MANUFACTURE CONTAINER.
3. Attorney's docket number EN9-92-074, Ser. No. 07/901,479, filed Jun. 19, 1992 for TRANSFER CONTAINER FOR TRANSFERRING FLIMSY CIRCUIT PANELS UNDER CLEAN ROOM CONDITIONS.

FIELD OF THE INVENTION

The invention relates generally to the manufacture of circuit panels, as circuit cards and circuit boards, including individual layers thereof, and more particularly to the manufacture of layers, cards, boards, and panels under clean room conditions, but without a clean room. The manufacturing processes are carried out in process enclosures that are isolated islands of clean room atmosphere, connected by interprocess transfer containers.

According to the invention described herein the process enclosure and the inter-process transfer container have an interlock for transferring panels, for example, in-process panels, without breaking clean room conditions. The interlock starts with facing sealable doors in the process enclosure and the transfer container.

The sealable doors are in air sealable facing recesses of the process enclosure and the transfer container. At least one peripheral gasket surrounds the recesses and the pair of doors to provide a substantially clean room environment in the airlock. The sealable door in the process enclosure is moved by a controllable electromagnetic clamp. This clamp clamps the ferromagnetic transfer container door. There is a ferromagnetic gasket between the sealable, ferromagnetic door in the interprocess transfer container and the process container. This provides a magnetic seal between the ferromagnetic door of the interprocess transfer container and the ferromagnetic door thereof.

Upon actuation, the electromagnetic clamp in the process enclosure door magnetically attracts the f container's ferromagnetic door and pulls it away from the ferromagnetic gasket. After the ferromagnetic door is clamped by the electromagnet, the process container door and the transfer container door are simultaneously opened.

BACKGROUND OF THE INVENTION

As dimensions shrink and circuit densities increase in circuit board and card manufacturing, the problems heretofore associated with and limited to IC manufacture are now increasing relevant to circuit board and card manufacture. For example, Class-100K and 10K cleanrooms are typically used in card and board manufacturing. Circuit cards and boards are 10" by 15", and even 24" by 28", and larger, with thickness of 1-5 mils, 2 mil feature sizes, and circuit densities that result in ten or more linear feet of Cu wiring per square inch of card or board surface.

In this 2 mil and smaller geometry environment, a dust particle that would have gone unnoticed in a 4 mil geometry environment can result in incomplete etching during subtractive circuitization resulting in an electrical open.

A small volume of still, particle free air, with no internal (local) source of particles is the cleanest possible environment for high circuit density circuit card and board manufacturing.

The Standard Mechanical Interface (SMIF) for Wafer Processing of Integrated Circuits A small volume of still, particle free is air, with no internal (local) source of particles is attained in the silicon semiconductor wafer industry by the SMIF (Standard Mechanical Interface) system. SMIF provides a movable sealable container and a series of small work volumes. The SMIF system includes means for loading and unloading the container, means for placing the wafers (and wafer cassettes) into and removing the wafers (and wafer cassettes) from an individual work volume, and a canopy to seal the movable sealable container and the work volume during transfer. Finally, the SMIF system includes work volume air processing means.

SMIF reduces the need for (1) costly, large volume air handling, and (2) temperature and humidity control.

The SMIF Container

U.S. Pat. No. 4,963,069 to Thomas Kahlden, Rudolf Simon, and Manfred Wurst for CONTAINER FOR THE HANDLING OF SEMICONDUCTOR DEVICES AND PROCESS FOR PARTICLE-FREE TRANSFER describes a container and transfer process are intended to prevent contamination of wafer scale semiconductor devices from occurring, even when the wafer container is stored or handled under unclean room conditions. The wafers inside the container are subjected to an approximately laminar clean air stream passing around them in a clean air zone. A higher static pressure is maintained in the clean air zone than in the surrounding space. The surrounding space is subject to pollution with an inadmissibly high number of particles. The clean air stream carries along any dirt particles there may still be, so that these dirt particles cannot settle on the semiconductor devices. As a result of the higher static pressure, a forced flow from the clean air zone of the higher static pressure outwards into the surrounding space is achieved. This prevents entry of dirt particles from the surrounding space.

U.S. Pat. No. 4,815,912 to George W. Faraco, George A. Maney, and Mihir Parikh for BOX DOOR ACTUATED CONTAINER describes a transportable container for wafers in-process. The container is designed for use with passage elevator means for passing the wafer cassettes between work station locations. The container includes the body member, an opening in the body member, an airlock door across the opening, and a wafer cassette. The wafer cassette is supported by the door and sized for passage through the door. Passage of the wafer cassette downward through open door is effected by an elevator.

U.S. Pat. No. 4,739,882 to Anthony C. Bonora, George Faraco, Barney H. Huang, and Mihir Parikh for CONTAINER HAVING DISPOSABLE LINERS describes a transportable container for storing articles, such as wafers, while maintaining the articles clean. The container utilizes a liner that is insertable into the interior space and surrounds the contents. The wafer cassette wafers are supported by the container door.

U.S. Pat. No. 4,724,874 to Anthony C. Bonora and Mihir Parikh for SEALABLE TRANSPORTABLE CONTAINER HAVING A PARTICLE FILTERING SYSTEM describes a sealable transportable container for use with semiconductor wafer processing equipment. The container is a double container, with an inner container and an outer container. The outer container has a port plate with a port door sealably mating to the port plate. Inside of the outer transportable container is an inner container, referred to as a box. This box has an interior space for containing the wafer cassettes. The box has a conduit for communicating between its interior space and the environment external to the box, i.e., the surrounding fabrication facility. The conduit has a filter for filtering fluids, i.e., air, passing through the conduit. The box is a sealed box with a box top having sealing surfaces and a box door sealably mating with the box top.

The port plate also includes sealing surfaces and is sealably mated to the box top. The port door has a sealing surface and is sealably mated to the port plate. The inner or box door includes a latch for mechanically opening and closing of the box. The outer or port door includes a device for activating the latch on the inner or box door.

The SMIF Docking Interface

U.S. Pat. No. 4,995,430 to Anthony C. Bonora and Frederick C. Rosenquist for SEALABLE TRANSPORTABLE CONTAINER HAVING IMPROVED LATCH MECHANISM describes a transportable, sealable container, such as a SMIF (Standard Mechanical Interface) pod, with an outer box and box door. The box has a first sealing surface and the box door has a second sealing surface. These sealing surfaces form a seal when the box door is moved in a sealing direction with respect to the box.

A latch mechanism is provided in the box door. This latch mechanism is operable in two stages. The first stage of operation moves the latch members from a retracted position to an extended position. In the retracted position the latch members are in the box door so as to allow to allow movement of the box door with respect to the box.

In the extended position the latch members are adjacent to latch surfaces of the box. Movement from the retracted to the extended position is performed without contact between the latch members and the latch surfaces. This avoids any scraping or rubbing action which would create particles in the "clean" interior region of the box.

The second stage of operation engages latch members with the latch surfaces to move the box door in the sealing direction; this second stage of the operation is also performed without scraping or rubbing of the latch members and the latch surfaces.

U.S. Pat. No. 4,674,939 for George Faraco, George A. Maney, and Andrew W. O'Sullivan for SEALED STANDARD INTERFACE APPARATUS describes a partitioned container apparatus for keeping workpieces, such as semiconductor wafers, clean during a fabrication sequence. The container is used to transport the wafers to and between ports in the canopies of the processing equipment.

The container has first and second regions for making first and second seals. A container door seals the workpieces into the box. The container has a second region for making the second seal and has a third region for making a third seal.

The processing equipment canopy ports are adapted for receiving the container and container door and for transferring the container door and the container contents into a region of the processing equipment beneath the canopy. The canopy has a first region for making the first seal with the container. Also, the canopy has a fourth region surrounding the port for making a fourth seal.

A port door is provided for closing the canopy port when no container is present. The port door has a second region for making the second seal with the container and has a fourth region for making the fourth seal with the canopy.

A container door latch is provided for latching the container door to the container so that the second seal is made and released in the second region between the container door and the container by operation of the container door latch.

A container latch is provided for latching the container to the canopy so that the first seal is made or released in the first region between the container and the canopy by the operation of the container latch.

U.S. Pat. No. 4,616,683 to Mark E. Johnston, Mihir Parikh, David L. Thrasher, and Barclay J. Tullis for PARTICLE-FREE DOCKABLE INTERFACE FOR INTEGRATED CIRCUIT PROCESSING (A continuation of U.S. Pat. No. 4,532,970) describes a particle-free dockable interface for linking together two spaces. Each of these spaces encloses its own separate clean air environment.

The interface has interlocking doors on each space which fit together to trap particles, that is, particles which have accumulated from the dirty ambient environment on the outer surfaces of the doors.

U.S. Pat. No. 4,534,389 to Barclay J. Tullis for INTERLOCKING DOOR LATCH FOR DOCKABLE INTERFACE FOR INTEGRATED CIRCUIT describes a particle-free dockable interface with an interlocking latch for linking together two spaces each enclosing a clean air environment. The dockable interface prevents the opening of the interface doors without the presences of two mating system components.

The interface has interlocking doors on each space which fit together to trap particles which have accumulated from the dirty ambient environment on the outer surfaces of the doors.

The interlocking latch has a latch spring and latch foot assembly coupled to a first one of the two clean air spaces and a mating door pull and port latch assembly coupled to the second of the two clean air spaces. The latch foot, door pull, and port latch assemblies are constructed so that the interlock doors cannot be opened unless the first and second clean air spaces are properly aligned and mated.

U.S. Pat. No. 4,532,970 to Mark E. Johnston, Mihir Parikh, David J. Thrasher, and Barclay J. Tullis for PARTICLE-FREE DOCKABLE INTERFACE FOR INTEGRATED CIRCUIT PROCESSING describes a particle-free dockable interface for linking together two spaces each enclosing a clean air environment. The interface is composed of interlocking doors on each space which fit together to trap particles which have accumulated from the dirty ambient environment on the outer surfaces of the doors.

SMIF Apparatus for Moving Cassettes

U.S. Pat. No. 4,859,137 to Anthony C. Bonora and Fred T. Rosenquist for APPARATUS FOR TRANSPORTING A HOLDER BETWEEN A PORT OPENING OF A STANDARDIZED MECHANICAL INTERFACE SYSTEM AND A LOADING AND UNLOADING STATION describes apparatus for transporting workpieces, as wafer cassettes, between a port opening of a work station and an inter-station transporter.

The apparatus includes a first platform for supporting the cassette between the port opening and the work station; an elevator for moving the first platform between the port opening and the work station; and an assembly for rotatably moving the first platform between a first position in which the first platform is oriented substantially perpendicular to a vertical axis and a second position in which the first platform is inclined relative to the vertical axis.

The assembly moves the first platform between the first and second positions while the elevator moves the first platform between the port opening and the work station.

U.S. Pat. No. 4,923,353 to John S. Bailey, D. R. Gunawardena, Ulrich Kaempf, and Barclay J. Tullis for APPARATUS FOR AUTOMATED CASSETTE HANDLING (Division of U.S. Pat. No. 4,705,444) describes an automated cassette handler used to transport IC wafer cassettes between first and second elevators in a standardized mechanical interface (SMIF) system for integrated circuit processing. The handler is adapted to grip and transport the cassette while positively pushing the wafers into the cassette.

U.S. Pat. No. 4,901,011 to Hisashi Koike and Sumi Tanaka for CARRIER FOR TRANSFERRING PLATE-LIKE OBJECTS ONE BY ONE, A HANDLING APPARATUS FOR LOADING OR UNLOADING THE CARRIER, AND A WAFER PROBING MACHINE FITTED WITH THE HANDLING APPARATUS FOR THE WAFER CARRIER describes a carrier for transferring individual semiconductor wafers. The carrier includes a tray portion to load the wafer for processing. The tray portion has a groove for unloading the wafer, and a mechanism for positioning the tray portion relative to a predetermined location of the drawer. A handling apparatus for the carrier includes a sampling case mounted to the frame of a wafer probing machine and having (i) a first opening communicating with the outside of the machine and (ii) a second opening communicating with the interior of the machine, (iii) a drawer adapted to go into and come out of the case through the first opening (i, above) and plural pairs of guide-rollers to guide the drawer between the first and second openings of the case. To take a sample from among the wafers in the machine, the carrier is loaded on the drawer, and pushed through the second opening into the case, where the wafer is then picked out by a full-automatic transferring apparatus from a wafer storage. The wafer is then inserted through the second opening into the case, and placed on the carrier by guiding it through the groove of the carrier and the drawer is pulled out.

U.S. Pat. No. 4,875,825 to John S. Bailey, D. R. Gunawardena, Ulrich Kaempf, and Barclay J. Tullis, for METHOD FOR AUTOMATED CASSETTE HANDLING (Continuation of U.S. Pat. No. 4,705,444), describes an automated cassette handler transporting an IC wafer cassette between first and second elevators in a standardized mechanical interface (smif) system for integrated circuit processing. The handler grips and transports the cassette while positively pushing the wafers into the cassette.

U.S. Pat. No. 4,802,809 to Anthony C. Bonora, and Andrew W. O'Sullivan for MANIPULATOR FOR STANDARD MECHANICAL INTERFACE APPARATUS (Continuation In Part of U.S. Pat. No. 4,676,709 and of U.S. Pat. No. 4,674,936), describes an apparatus for transferring an IC wafer cassette to and from a container supported at a processing station. The processing station has a cassette port for receiving the cassette when the cassette moves along a central axis extending from outside the processing station through the cassette port, and into the processing station.

The apparatus includes (i) a transportable cassette platform for transferring the cassette to and from the container; (ii) a manipulator having (a) a first member extending substantially orthogonal to the central axis of movement of the cassette platform and (b) a movable second portion; (iii) a pivoting arm with (a) a pivoting portion and (b) a coupling portion, where the pivoting portion mounted pivotally adjacent to the movable second portion (ii-b) of the first member (ii). The pivoting arm (iii-b) is operable to pivot about a pivot axis extending substantially through the pivoting portion and substantially perpendicular to the central axis of the cassette platform. A coupling device is mounted on the coupling portion (iii-a) of the pivoting arm for coupling to the cassette. A tilt device tilts the coupling device and the cassette coupled to it during pivoting by the pivoting arm, so that during the pivoting the cassette tilts relative to the central axis.

U.S. Pat. No. 4,705,444 to John S. Bailey, D. R. Gumawardena, Ulrich Kaempf, and Barclay J. Tullis for APPARATUS FOR AUTOMATED CASSETTE HANDLING describes an automated cassette handler for transporting an IC wafer cassette containing integrated circuit wafers between first and second elevators in a standardized mechanical interface (smif) system for integrated circuit processing. The handler is adapted to grip and transport the cassette while positively pushing the wafers into the cassette.

U.S. Pat. No. 4,676,709 to Anthony C. Bonora and Andrew W. O'Sullivan for LONG ARM MANIPULATOR FOR STANDARD MECHANICAL INTERFACE APPARATUS describes a manipulator for removing a cassette holding work pieces to be processed, such as semiconductor wafers, from a container supported on a processing station in a standard mechanical interface (smif) system. The container is supported on an interface port on the canopy of the processing station and has a removable door on which the cassette is supportable. A first platform is transportable along a shaft below the interface port and is operable to mate with the interface port and receive the cassette from the container. The first platform is transported down the shaft, thereby removing the cassette from the container. A second platform mounted in the shaft includes a manipulator arm which swings to engage the cassette on the first platform and support the cassette off of the first platform. The manipulator arm then pivots to transport the cassette to a location in the processing station away from the shaft. The first platform is then transported back up the shaft to the interface port to seal the container to prevent particulate contamination. The manipulator arm and the second platform after placing the cassette at a location in the processing station away from the shaft, are then positioned completely inside the shaft to minimize the space taken up in the processing station by the manipulator.

U.S. Pat. No. 4,674,936 to Anthony C. Bonora for SHORT ARM MANIPULATOR FOR STANDARD MECHANICAL INTERFACE APPARATUS describes a manipulator for removing a cassette holding workpieces to be processed, such as semiconductor wafers, from a container supported on a processing station in a standard mechanical interface (smif) system. The container is supported on an interface port on the canopy of the processing station. A first platform is transportable along a shaft below the interface port. The platform is operable to mate with the interface port and receive the cassette from the container. The first platform is transported down the shaft, thereby removing the cassette from the container. An arm orthogonal to the shaft and mounted in the shaft supports a pivoting arm which swings to engage the cassette on the first platform and support the cassette off of the first platform. The pivoting arm pivots to transport the cassette to a location away from the shaft. The first platform is then transported back up the shaft to the interface port to seal the container to prevent particulate contamination. The pivot arm then pivots to swing the cassette to a host elevator which is located in alignment with the shaft below the first platform.

U.S. Pat. No. 4,636,128 to Thomas C. Bimer, Alton D. Lewis, and Edwin G. Millis for SEMICONDUCTOR SLICE CASSETTE TRANSPORT UNIT describes a transport mechanism for transporting an IC wafer cassette between a clean carrier and a process machine. The transport unit has a housing having a forward portion positioned in the people-occupied area of the clean room and a rear portion positioned in the process machine area, and aerodynamically isolated from people. A moveable glider plate is adapted to receive the carrier. This moveable glider plate is initially positioned in an aperture provided in the upper surface of forward portion of the transporter. A gearing mechanism is provided which cooperates with glider plate to move the IC wafer cassettes mounted on the base of carrier between the forward portion and the rear portion of the carrier. The wafers are shielded from particulate contamination both (1) as the wafer cassette is transported on the glider plate between the forward and rear portions of the transporter and (2) when evacuating any particulate contamination generated within the transport mechanism.

U.S. Pat. No. 4,343,584 to Jerry Hudgins for APPARATUS FOR SEQUENTIALLY TRANSPORTING CONTAINERS describes an apparatus for transferring and manipulating a plurality of containers in a sequence. The apparatus includes a mechanical manipulator arm having a gripping device which automatically picks up a container at a fixed pickup position and transfers it to a processing station. At the processing station, the container is loaded with silicon wafers and returned by the arm to the fixed position (the initial pickup station). A plurality of the containers may be processed in sequence from the fixed pickup position by providing a movable carriage upon which container pedestal platforms are supported. At least one of the container pedestal platforms is an elevator platform.

The platforms include abutments for properly positioning the containers for accurate pickup by the manipulator arm. Sensing switches may be provided for sensing movements of the arm, the carriage, and the elevator platform. In this way the entire apparatus may be controlled automatically. This avoids the need to handle the wafers manually, reducing the possibility of contamination.

The SMIF System

U.S. Pat. No. 4,851,018 to Henri Cortial and Jean-Pierre Lazzari for INSTALLATION FOR THE STORAGE AND TRANSFER OF OBJECTS IN A VERY CLEAN ATMOSPHERE describes s system including (1) a cabinet for storing workpieces, (2) apparatus for processing these workpieces, and (3) apparatus for transferring these workpieces between the storage cabinet and processing apparatus. The transfer is carried out through mobile containers and fixed containers fixed to the processing apparatus.

The mobile containers can be coupled to the cabinet and to the fixed containers in order to carry out the transfer of the workpieces.

U.S. Pat. No. 4,781,511 to Hiroshi Harada, Tsutomo Ishida, Yoshiyuki Iwasawa, and Shintaro Kobayashi for SEMICONDUCTOR PROCESSING SYSTEM describes a semiconductor processing system which includes: (1) a first semiconductor wafer cassette for housing semiconductor wafers; (2) a first transfer pod for enclosing the first cassette airtightly; (3) wafer processing equipment having a first port for loading the cassette and a canopy covering the first port; and (4) a first mechanism for transferring the first cassette between the first port of the processing equipment and the first pod without exposing the cassette and the wafers therein to outside contamination.

The first transfer pod has a box-like pod body with an open bottom and a bottom plate detachably attached to the pod body for closing the bottom of the pod body.

The first transferring mechanism includes: a second port, provided on the canopy of the processing equipment at the position directly above the first port, for placing the first pod on the second port. The second port includes a port assembly for attaching and detaching the bottom plate of the first pod to and from the pod body when the first pod is placed on the second port. The transferring mechanism also includes a first lift mechanism, arranged mainly between the first and second ports, for conveying the bottom plate of the first pod between the first and second ports when the bottom plate of the pod is detached from the pod body.

The processing equipment processes wafers in the first cassette when the cassette is loaded in the first port.

Shortcomings of the SMIF System

The SMIF solution, while adequate for wafer processing, including batch processing of cassettes of large semiconductor wafers, e.g., wafers of up to about 5 inches in diameter, is not directly applicable to panel fabrication. This is because panels are far larger, the smallest panels having at least ten times the surface area of the largest wafers. Moreover, the individual layers making up the finished thin panels are flexible films, e.g., flexible and flimsy polymeric films, including copper foiling bearing polymeric films, less than 0.01 inch thick. For these reasons, wafer processing techniques are not directly applicable to panel fabrication.

OBJECTS OF THE INVENTION

It is a primary object of the invention to provide clean room environments for panel processing and fabrication.

It is a further object of the invention to isolate the panels in-process from human generated sources of contamination.

It is a further object of the invention to provide a clean room environment of Class-100 air for panel processing and fabrication for panel processing and fabrication in close proximity to the actual panel processing and fabrication.

It is a still further object of the invention to maintain clean room conditions during interprocess transfer between pairs of process enclosures.

SUMMARY OF THE INVENTION

These and other objects of the invention are accomplished by the method and apparatus of our invention. Specifically, the invention described herein utilizes isolated islands of clean room grade air to provide assured cleanliness. This is accomplished even in the event of external transients and disturbances.

The apparatus of the invention provides a clean room environment without a clean room. The clean room environment is provided in close proximity to the in-process circuit cards and boards. More particularly, the clean room environment is provided in islands or enclosures of clean room grade, substantially contaminant free, air. By this expedient it is possible to avoid the expense and difficulty of providing a large cubic foot clean room, with clean room conditions tens of feet away from the nearest card or board. Significantly relaxed, operator friendly, clean room standards are maintained in the rest of the process area.

The method and apparatus of the invention isolates panels, cards and boards in-process from human generated contamination, such as hair, skin, and breath, and isolates the work space and its environment through dedicated work space enclosures that direct clean air, e.g., Class-100 air, into the process equipment enclosures through carefully engineered and focused Class-100 air handling equipment.

According to the invention, Class-100 standards are attained and maintained in proximity to the in-process cards, boards, and panels, rather then just at the ceiling of the clean room. This is accomplished by partitioning large volume panel, board, and card fabrication facilities into smaller volumes. These smaller volumes permit precise monitoring and control of the card and board fabrication environment. Moreover, separating the "human side" of the facility from the "clean side" of the process minimizes human borne sources of contamination.

Partitioning the contaminant sensitive work pieces and process steps from the rest of the plant is accomplished through an integrated system of process equipment containing process enclosures of controlled atmosphere, dustproof transporter boxes, and airlock and material handling interfaces between the process equipment process enclosures and the transporter boxes.

1. Process Equipment Enclosures

The equipment, such as process equipment, necessary to perform a step or set of steps of a manufacturing process are housed in individual work station enclosures. These enclosures have dedicated engineered clean air flow, and, in this way, isolate the equipment and the in-process panels from the surrounding dirty air. As such, they are analogous to SMIF enclosures with built-in engineered air flow that isolate wafer processing equipment in a "clean" environment.

2. Inter-Process Transporters

Panels, including batches of in-process panels, are transported between process equipment enclosures by inter-process transporters. These inter-process transporters are analogous to the SMIF Pod ®, a sealed wafer carrier that completely isolates the wafers from the environment between "clean" enclosures. However, the SMIF Pod ® is used transport cassettes of small, rigid wafers, while the inter-process transporter disclosed herein transports, large, thin, flimsy, flexible panels. This function gives rise to significantly different mechanical problems.

These dustproof inter-process transfer boxes interface with the small volume process equipment process enclosures through airlocks. The airlocks interfacing between the process equipment and the transporter boxes, have linear dimensions that are also several orders of magnitude greater then those encountered in SMIF wafer handling equipment.

3. Transporter-Enclosure Transfer Mechanisms

While the transfer mechanism appears to be analogous to the SMIF Arm ® robotic mechanism which is the automatic transfer mechanism that removes wafer cassettes from the SMIF Pods ® and places them on the indexing means within the SMIF enclosures, the transfer mechanism described herein works with larger, flexible, flimsy, non-rigid work pieces. The transfer mechanism transfers the large, non-rigid, flimsy, flexible in-process panels, cards, and boards from the transfer container to the process enclosure, and from the process enclosure to the transfer container.

4. Interprocess Interlock

The transporter-enclosure transfer mechanism works in combination with an iinterlock which serves to maintain clean room conditions during panel transfer between the transporter and the enclosure. Thus, according to the invention described herein the process enclosure and the inter-process transfer container have an interlock for transferring panels, for example, in-process panels, without breaking clean room conditions. The interlock starts with facing sealable doors in the process enclosure and the transfer container.

The sealable doors are in air sealable facing recesses of the process enclosure and the transfer container. At least one peripheral gasket surrounds the recesses and the pair of doors to provide a substantially clean room environment in the airlock. The sealable door in the process enclosure is moved by a controllable electromagnetic clamp. This clamp clamps the ferromagnetic transfer container door. There is a ferromagnetic gasket between the sealable, ferromagnetic door in the inter-process transfer container and the process container. This provides a magnetic seal between the ferromagnetic door of the interprocess transfer container and the ferromagnetic door thereof.

Upon actuation, the electromagnetic clamp in the process enclosure door magnetically attracts the f container's ferromagnetic door and pulls it away from the ferromagnetic gasket. After the ferromagnetic door is clamped by the electromagnet, the process container door and the transfer container door are simultaneously opened.

5. Robotics and Computer Integration

The card carrier provides logistic control and tracking of in-process panels, cards, and boards. This allows increased throughput with reduced inventories. Robotic control of the panel carrying process, including the inter-process transfer boxes and the transporter to process enclosure transfer system, especially when combined with computer integrated manufacturing (CIM) real time management, provides an information interface between the panels in-process and the individual work stations.

For example, the airlock activation, which is necessary for transferring in-process panels, cards, and boards, becomes an identifiable control event. This event initiates identification of both the panel carrier and the panels to a specific manufacturing step. In turn, the identification of a particular batch of panels at a specific work station initiates a sequence of steps within the work station environment. This sequence of steps can then be used to adaptively control downstream manufacturing steps in downstream work station environments. By this expedient work in-process tracking is combined with localized process control.

The method and apparatus of the invention is, therefore, more then just a "Scale Up" of SMIF technology. The method and apparatus of the invention utilizes (1) small gas volume, multi- work station enclosures for processing flexible, large surface area panels, cards, and boards, with (2) minimum volume, dustproof transfer containers for storing, transferring, and handling panels, cards and boards, (3) tools for transferring the in-process panels, cards, and boards between individual transfer containers and the work stations, (4) fixtures to hold the large, flexible in-process panels, and (5) computer integration of the process steps and apparatus.

THE FIGURES

The invention can be understood by reference to the figures shown below.

FIG. 5, including FIGS. 5A, 5B, 5C, 5D, 5E and 5F shows a panel, a fixture for carrying the panel through the manufacturing processes, a chuck for assembling the fixture and the panel, and an assembly sequence for assembling the panel and the fixture.

Figure 6A:
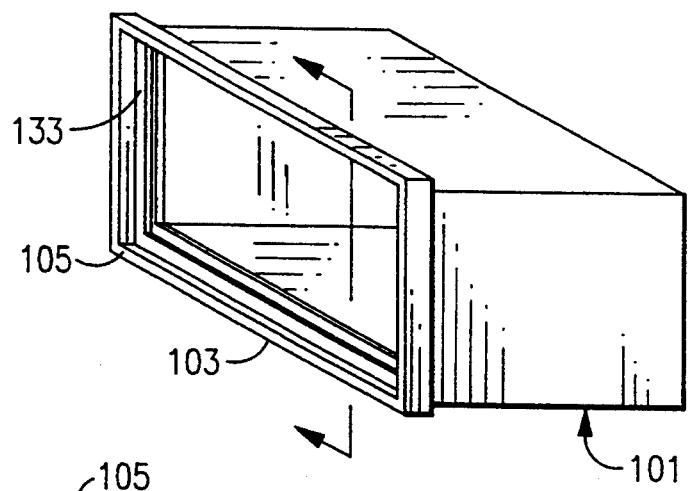
Figure 6B:
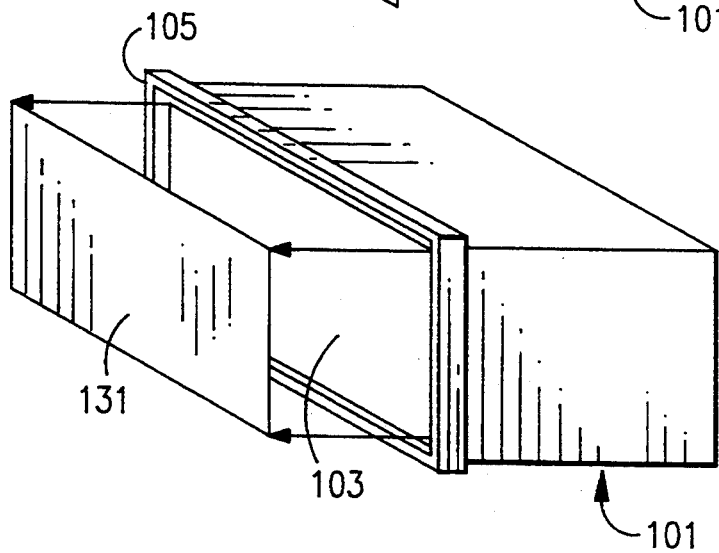
Figure 6C:
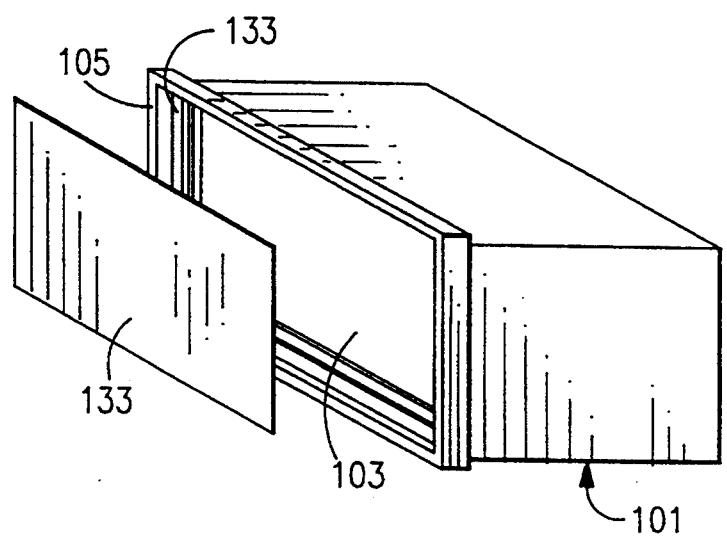

FIG. 6, including FIGS. 6A, 6B and 6C, shows a perspective view of the transfer container, used for transporting panels to and between process enclosures in clean room conditions. The sequence, FIGS. 6A, 6B and 6C, shows an open container, and the relationship of the ferromagnetic door of the container to the container.

Figure 7A:
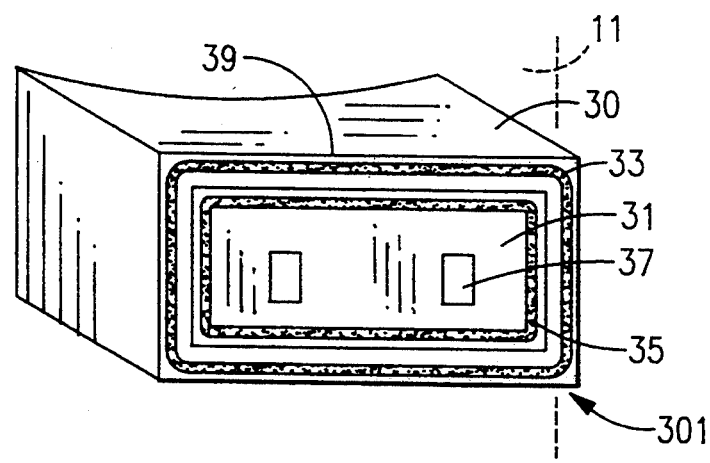
Figure 7B:
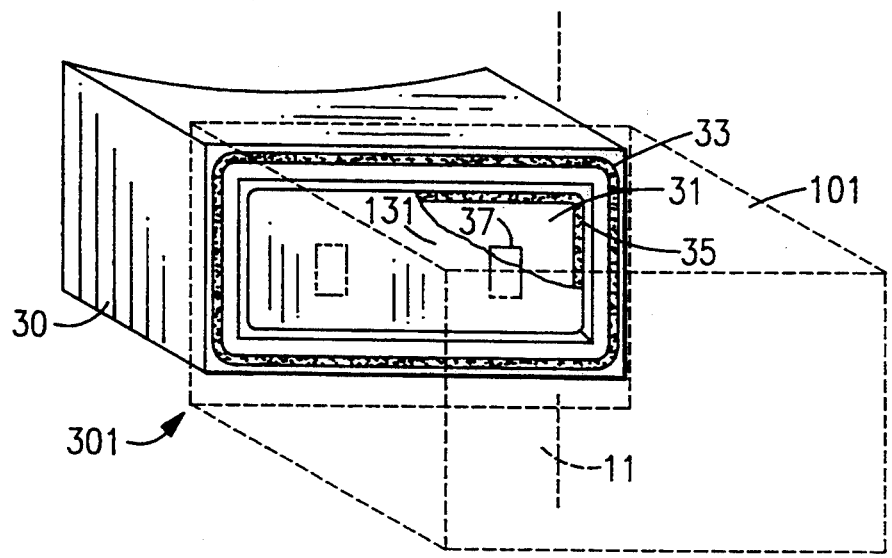
Figure 7C:
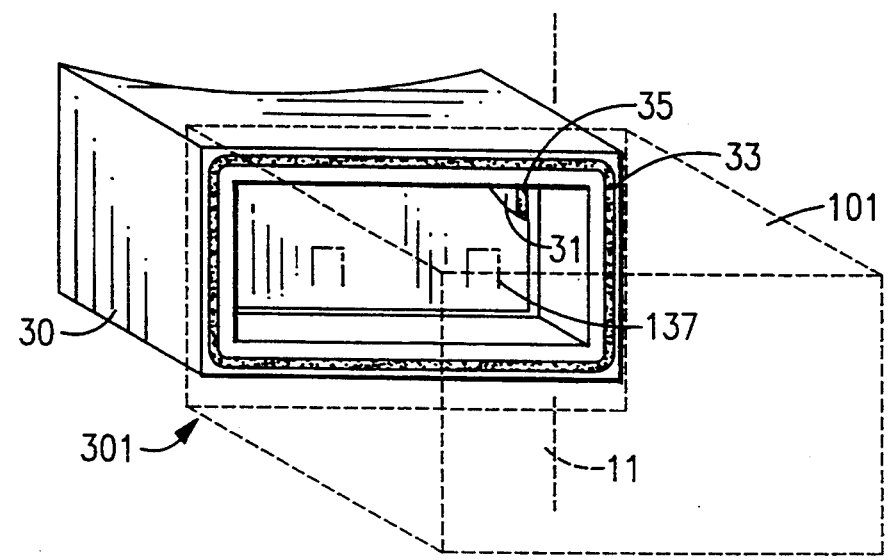

FIG. 7, including FIGS. 7A, 7B, and 7C, shows a perspective view of the docking interface of the process enclosure, and the sequence of steps to electromagnetically draw the ferromagnetic door of the transfer container against the electromagnetic equipped door of the docking interface, and then robotically open the door of the docking interface container.

Figure 8:
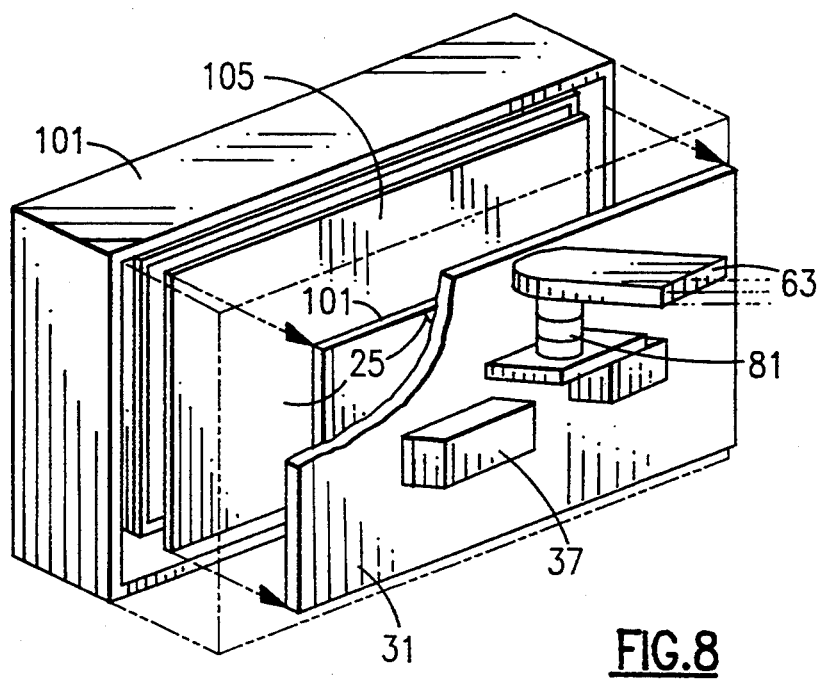

FIG. 8 shows the opposite surface of the door of the docking interface, including the attachment point for the robotic arm, and the electromagnets.

FIG. 9, including FIGS. 9A, 9B, and 9C, shows a cutaway view, along cutting plane 9-9' of FIG. 6A, of the docking structure of the docking interface of the process enclosure and the transfer container.

Figure 10:
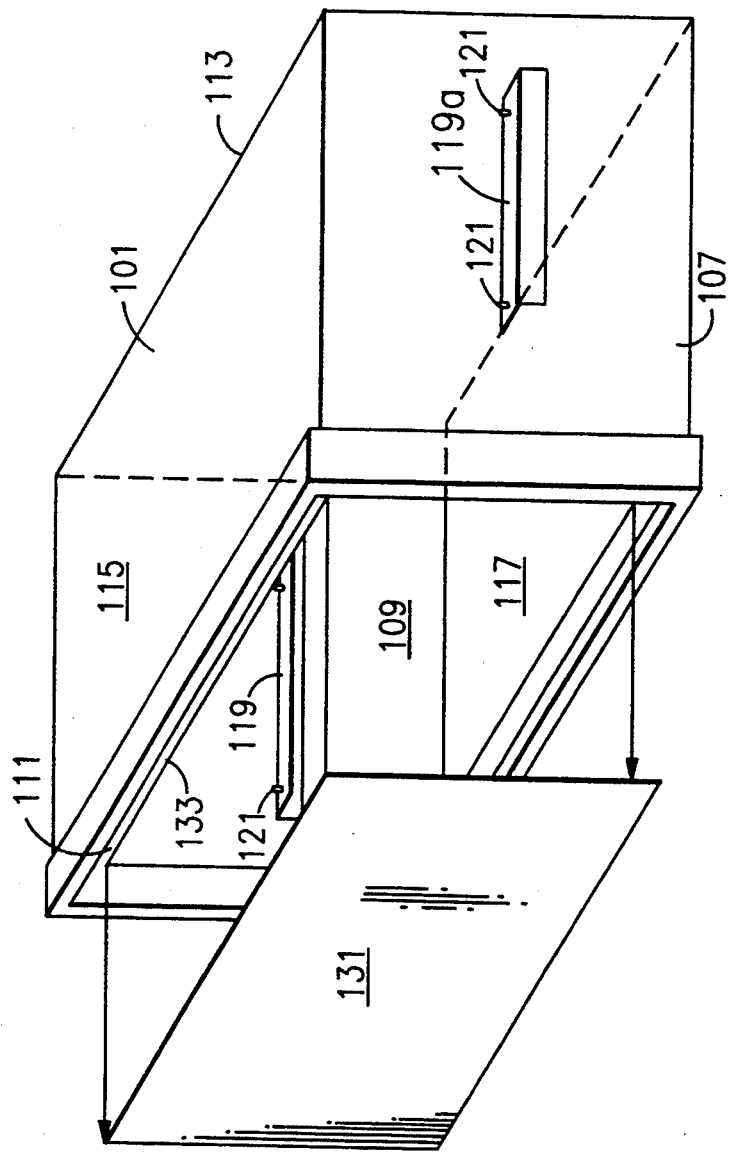

FIG. 10 is a cutaway view of a transfer container showing shelves and brackets for carrying in-process panels.

Figure 11:
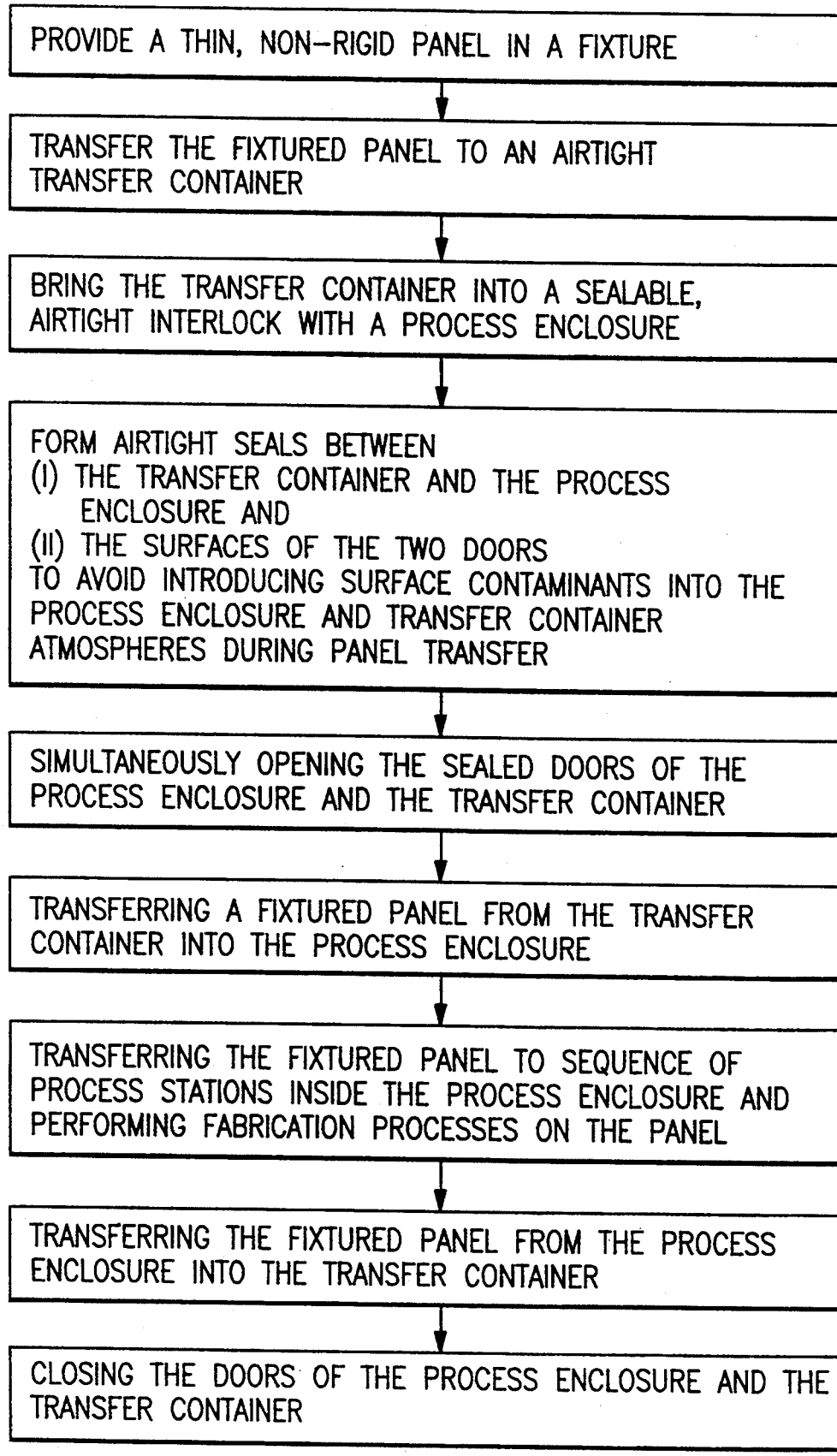

FIG. 11 is a process flow chart for the integrated process of the system.

DETAILED DESCRIPTION OF THE INVENTION

The integrated process and system for handling in-process panels, cards, and boards includes:

Localized, sealed clean-room enclosures for process equipment. These sealed enclosures contain process equipment stations in a highly localized and contained, clean room environment.

Minimum volume, dustproof containers for transferring, storing, and handling cards and boards. These transfer containers are several magnitudes greater volume then SMIF boxes for wafers. These transfer containers have clean room capability, and are fabricated of materials of construction that are relatively free of sources of contamination. Exemplary materials are unfilled, transparent polycarbonates. This is because fillers are a source of particulates. Preferably the transfer containers are transparent. This makes it easier for the operator to align the doors at the dockable interface with the equipment enclosure, and also to handle in-process panels inside and during docking.

Mating airlocks at the interface between the process equipment enclosures and at the transfer containers, where linear dimensions of the airlocks are several orders of magnitude greater then those required for wafer handling equipment.

Transfer arm means for transferring the in-process panels between the transfer containers and the process enclosures.

Jigs and tools for holding the large, non-rigid in-process during transfer.

Computer monitoring and integration of the in-process panels, the process sequences and steps, and the total process.

System Components

Figure 1:
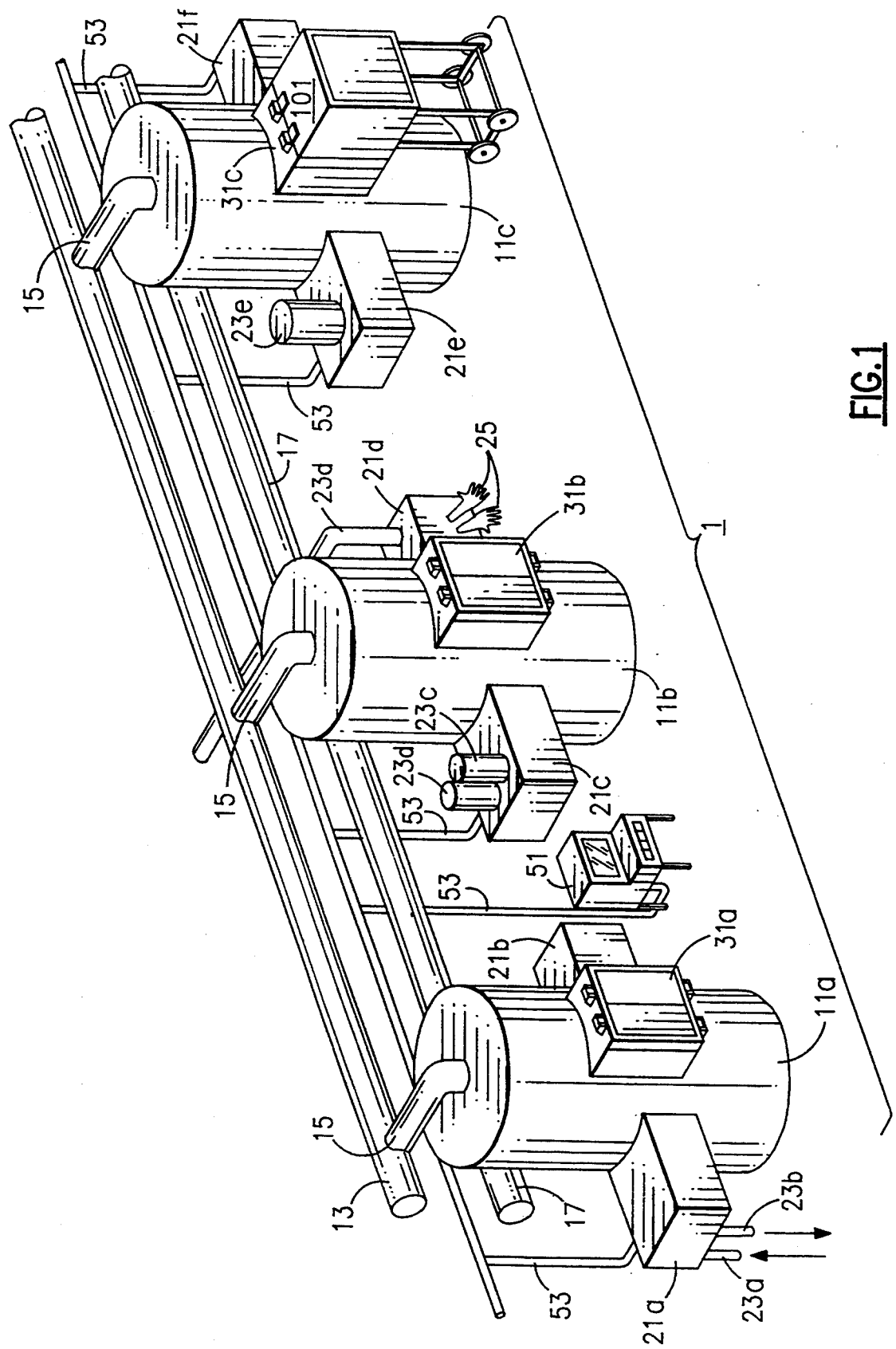
FIG. 1 is a general system overview showing a plurality of process enclosures. Each of the process enclosures has one or more contained process stations, a robotic unit, and a docking interlock for docking with a panel transfer container.

A system overview is shown in FIG. 1. The overall system 1, is shown with three robotic process enclosures 11a, 11b, and 11c. It is, of course, to be understood that there may be a series of such stations. The clean room atmosphere within each process enclosure is maintained by air lines or manifolds 13 bringing Class 100 or cleaner air, to each process enclosure 11a, 11b, 11c. In the FIGURE a common header 13, with individual lines 15, to each process enclosure 11a, 11b, and 11c, is shown. It is, of course, to be understood that each process enclosure 11a, 11b, 11c, may have a dedicated air line. Air is removed through exhaust header or manifold 17.

In a still further embodiment of the invention a pressurized ceiling plenum may carry Class-100 or cleaner air to all of the enclosures. In this alternative embodiment, the enclosures extend to the ceiling HEPA filters (high efficiency particulate air filters) in the ceiling.

The gas returns, shown in FIG. 1 as a header or manifold 17, can extend from the process enclosure 11 out to the room, or the gas can be ducted back for further filtering and reuse, or even exhausted.

Each process enclosure 11 has one or more process stations 21a, 21b, 21c, 21d, 21e, and 21f contained therein. Typically, each process enclosure 11 can be dedicated to a sequential set of process steps, and each process station 21 within a process enclosure 11 is dedicated to an individual process or step in the fabrication of panels. These steps may be under real time, on-line process control, as robotic steps. Alternatively, they may be under operator control, as through glove boxes, vision systems, and the like. For example, processes such as mechanical drilling, punch pressing, laser drilling, seeding, plating, etching, photoresist deposition, photoresist exposure, photoresist developing, and photoresist stripping can be carried out without operator intervention. However, processes such as alignment, lamination, bonding and the like can also be carried out in the process stations 21, but, possibly with operator intervention.

A set of process stations, for example sequential process stations 21a and 21b, or 21c and 21d, or 21e and 21f, are incorporated into and communicate through individual process enclosures, as 11a, 11b, or 11c. This reduces the opportunities for inadvertent exposure to the ambient environment.

An individual process station, as process station 21a, may be designed for wet processes, with process piping 23a and 23b. Alternatively, an individual process station, as process stations 21c, 21d, 21e, and 21f, may be adapted for other processes, as testing and repair of circuit lines, photo-resist deposition, photolithography (including dry side exposure or wet side developing or stripping).

Process stations, as process station 21d may be glove boxes, with gloves 25 extending therefrom for intervention and treatment of panels. This is especially true for process requiring an operator, as alignment, lamination, or bonding.

The process stations 21 and the processes contained therein may be controlled by various means. FIG. 1 shows a personal computer or work station 51, communicating with the process enclosures 11, and with the individual process stations 21a, 21b, 21c, 21d, 21e, 21f, and the processes contained therein, through local area network means 53. The extent of control may be as simple as job sequencing, or as involved as work in process identification, with work piece identification indicia (for example bar coded work piece indicia or magnetic strip work piece indicia), control of photomasks, drill patterns, sequences of process stations, and the like.

Figure 2:
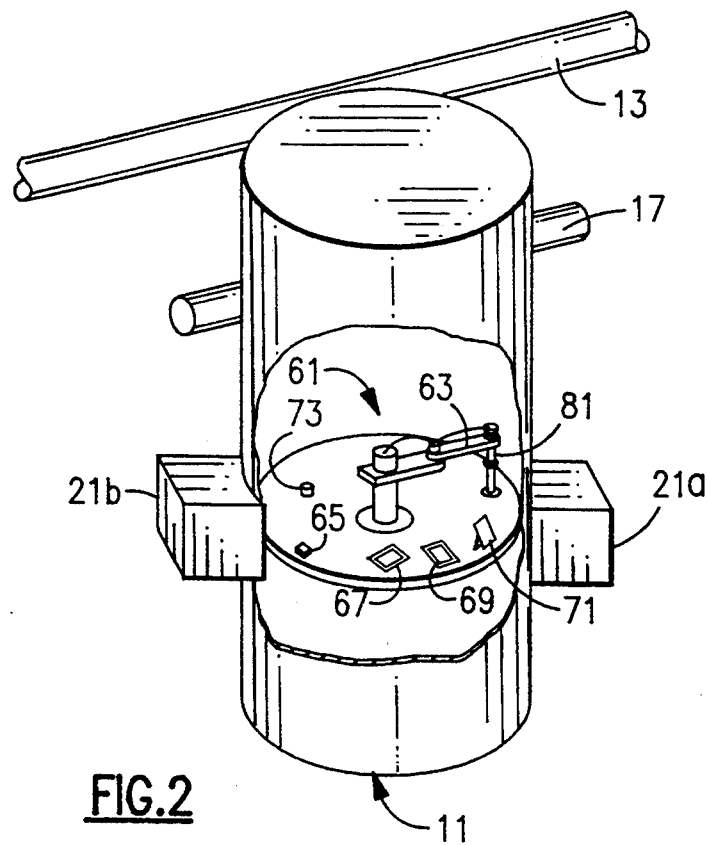
FIG. 2 is a partial cutaway view of a single process enclosure, showing individual process stations therein and the robotic unit.
Figure 3:
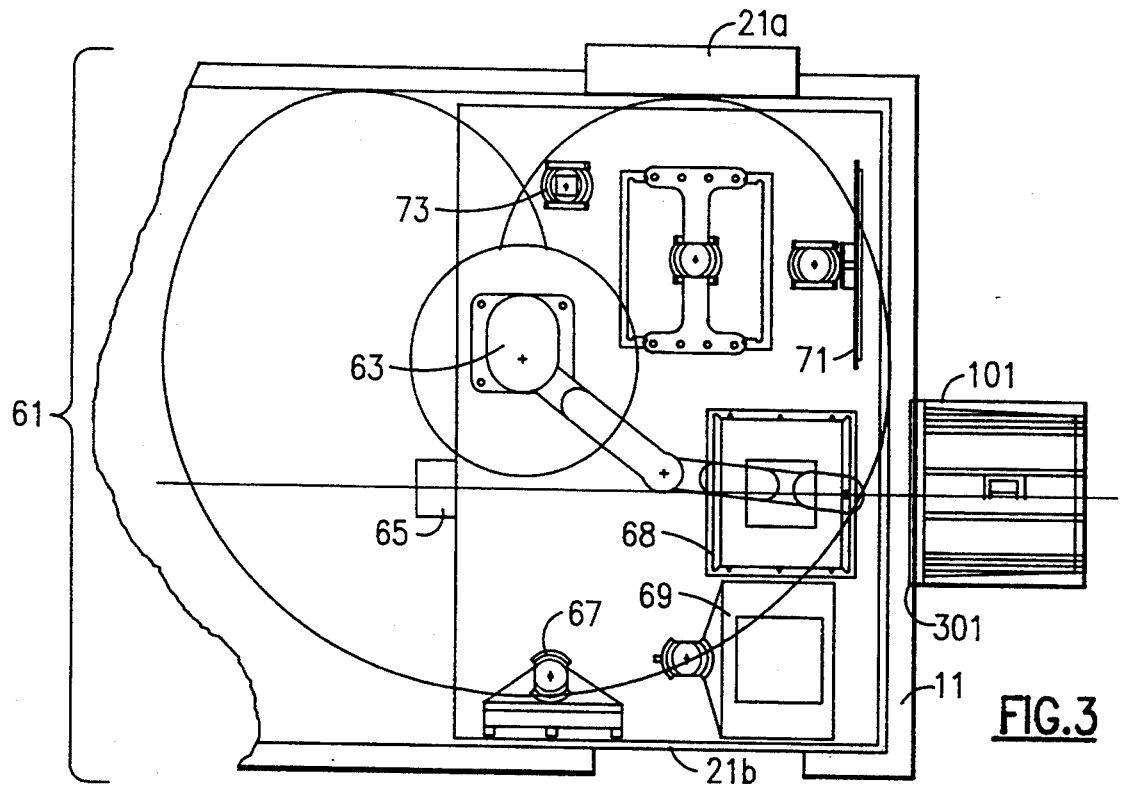
FIG. 3 is a top view, in cutaway, of a single process enclosure, showing the robotic arm and the panel transfer container.
Figure 4:
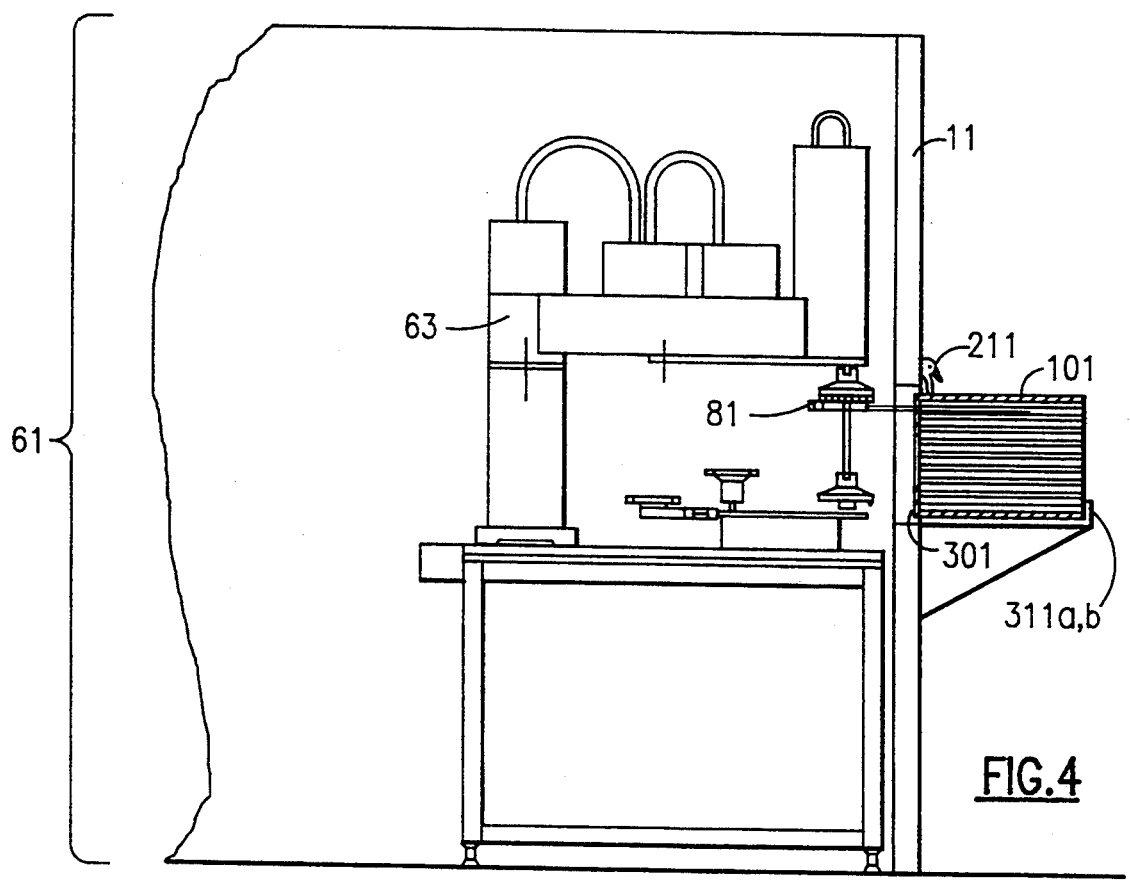
FIG. 4 is a side elevation, also in cutaway, of the single process enclosure shown in FIG. 3, showing the robotic arm and the panel transfer container.
Figure 5A:
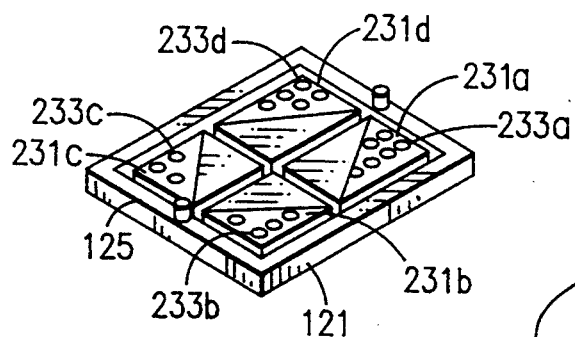
Figure 5B:
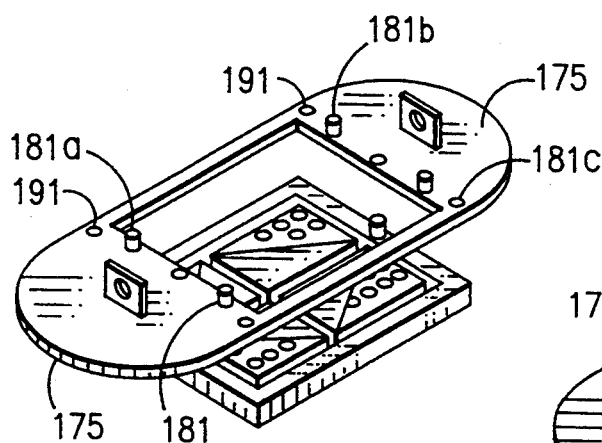
Figure 5C:
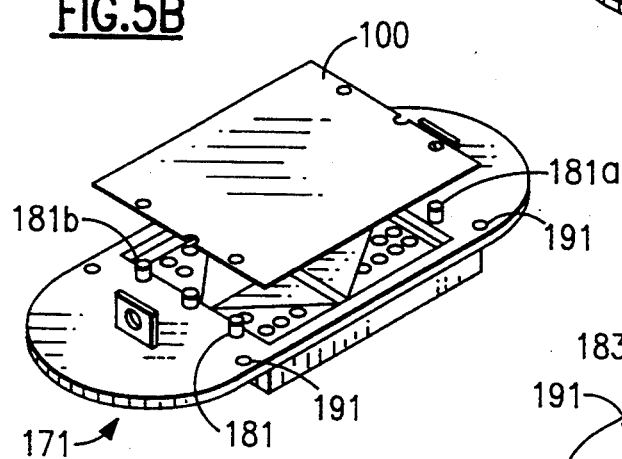
Figure 5D:
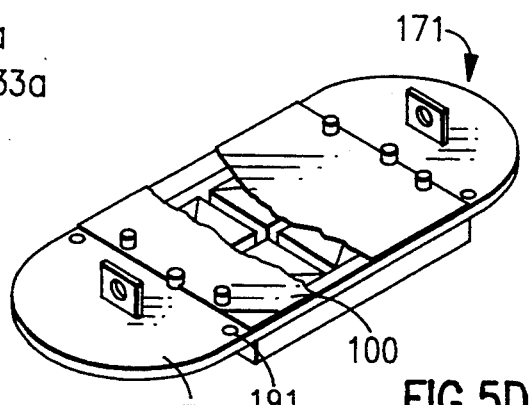
Figure 5E:
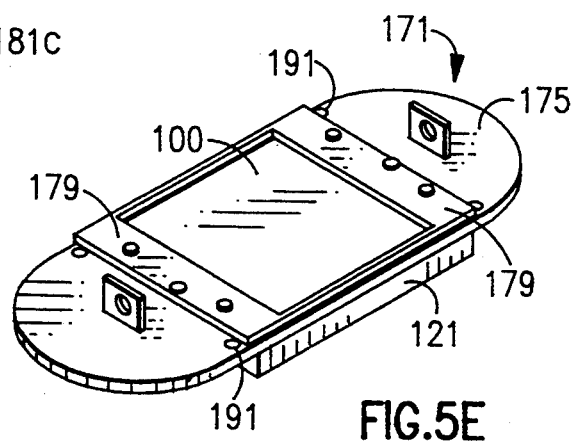
Figure 5F:
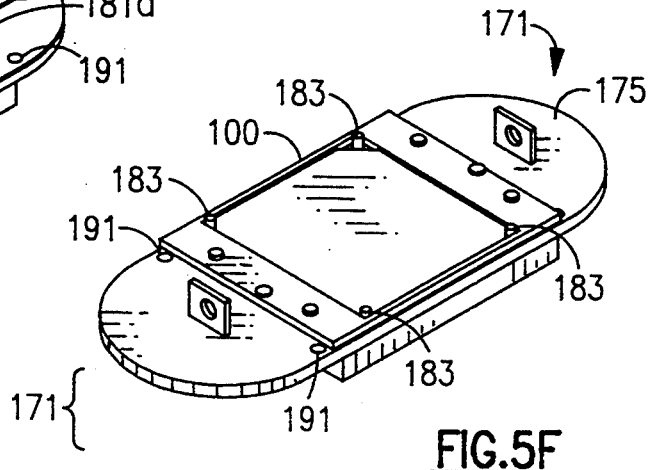

Within each process enclosure 11, inter-process transfer is provided without breaking clean room integrity. This is accomplished through the use of robotic transfer means, as shown in FIGS. 2, 3, and 4. FIG. 2 is a representation of one form of a SCARA (Selective Compliant Assembly Robot Arm) robot 61 within a process enclosure 11, while FIGS. 3 and 4 are top and plan views of an alternative form of a SCARA robot. The same numbering is used in FIG. 2 and in FIGS. 3 and 4.

In FIG. 2 the robot system 61 is shown inside of the process enclosure 11, with process stations 21a and 21b. In FIG. 3 the robot system 61 is shown in combination with the SCARA robot, 63; a bar code scanner, 65; a wet frame and tray grabber, 67; a vacuum chuck 68; vacuum grabber, 69, for substrates; a process enclosure box door grabber 71; and a screw driver 73. The effector arm of the SCARA robot also includes a quick change wrist 81 shown in FIGS. 2 and 4.

In-Process Panel Fixtures

The flexible in-process panels 100 are carried by a fixture 171, shown in FIG. 5, including FIGS. 5A, 5B, 5C, 5D, 5E, and 5F. The fixture is part of a multi-component system, including a vacuum loading chuck 121 and the two-part fixture 171. The two part fixture 171 includes a bottom plate 175 and a frame 179. The flexible in-process panels 100 are carried by a fixture 171, shown in FIG. 5, including FIGS. 5a, 5b, 5c, 5d, 5e, and 5f. The fixture is part of a multi-component system, including a vacuum loading chuck 121 and the two-part fixture 171. The two part fixture includes a bottom plate 175 and a frame 179.

In order to avoid abrasion and resultant contamination, the vacuum loading chuck 121 and the fixture 171 are made of polytetrafluoroethylene coated metal. This minimizes particulate generation and possible damage to the panels. The chuck 121 has four bearing surfaces, 231a, 231b, 231c, and 231d. These four bearing surfaces 231a, 231b, 231c, and 231d, are connected by slide actuators. Vacuum holes 233a, 233b, 233c, and 233d are shown in FIGS. 5A through 5F. These vacuum holes are in the top surfaces of the four bearing surfaces 231a, 231b, 231c, and 231d. These vacuum holes 233a, 233b, 233c, and 233d allow a vacuum to be drawn on the underside of the card, board, or panel, 100 holding it flat against the bearing surfaces 231a, 231b, 231c, and 231d.

The peripheral edges 125 of the vacuum loading chuck 121 are recessed below the plane of the tops of the bearing surfaces 231, such that the bottom surface of the fixture 171 will fit onto the recessed surface 125 of the vacuum loading chuck 121.

The workpiece, 100, as an in-process printed circuit board, or a single layer thereof, is laid on the loading chuck 121, and located by locating pins 181a, 181b, 181c, and 181d. A vacuum is then applied to the under surface of the work piece 100 through the vacuum holes 233a, 233b, 233c, and 233d, and tension is applied to the work piece by diagonal motion of each of the bearing surfaces 231a, 231b, 231c, and 231d, of the vacuum loading chuck 121 away from the central portion of the chuck. The amount of tension is easily adjustable by the operator or by numerical control methods.

Once suitable tension in the workpiece 100 is achieved, the top piece 179 of the fixture 171, a work piece frame, is positioned over the bottom plate 175 of the fixture 171 and lowered into place. Guide pins 181a, 181b, 181c, and 181d, on the bottom portion 175 of the fixture 171 provide centering of the workpiece 100 and the top or work piece frame portion 179 of the fixture 171 with the bottom plate of the fixture. A plurality of fasteners, are used to secure to top or work piece frame portion 179 of the fixture 171 to the bottom plate portion 175 of the fixture 171.

Tension in the panel (which may as thin as 1 mil) is generated by the motion of the four bearing surfaces, 231a, 231b, 231c, and 231d of the vacuum loading chuck 121. This tension is readily maintained by the compression of the work piece frame 179 of the fixture 171 and the bottom plate 175 of the fixture 171 on the workpiece 100.

The loading of a workpiece 100, such as a card, board, or panel 100, into a fixture 171 and the removal of the workpiece 100, such as a board, card, or panel 100 from the fixture 171 can be done robotically, in clean room conditions. In the robotic alternative, shown with specificity in FIG. 3, the robot end effectors would be a vacuum grabber, 69, a screw driver, 73, and a vacuum loading chuck, 68, to hold the individual panels.

Precision alignment of the panels is not required. The fixture 171 need only provide coarse alignment; a separate vision system is used to do fine alignment utilizing registration fiducials.

This vision system utilizes either or both of the top frame 179 or bottom plate 175 of the fixture 171, which are provided with indicia, such as bar code, for computer identification and control purposes.

Transfer Container and Interface

The interface between the localized, clean room environment of the individual process enclosure 11 and the inter process transfer container 101 is provided by an airlock transfer port. The airlock transfer port utilizes a combination of (1) co-operating sealable doors, 31, 131, in the process enclosure 11 and the transfer container 101, (2) electromagnetic and ferromagnetic clamping means for simultaneously opening the doors, and (3) peripheral gaskets surrounding the pair of doors to provide a substantially clean room environment in the airlock. This interface is illustrated in FIGS. 6 through 9.

FIGS. 6 through 9 show the docking of the transfer container 101 and the process enclosure 11 at the mechanical docking interface 301 in detail. The mechanical interface is shown in FIGS. 3 and 4.

The mechanical interface 301 is designed such that the transfer container 101 is loaded onto a shelf with guide surfaces 311a, 311b for location control, also shown in FIG. 4.

A latch mechanism 211, shown in FIG. 4, secures the transfer container 101 to the interface 301 and prevents accidental removal during the robotic loading and unloading.

The interface mechanism 301 of the transfer container 101 and the process enclosure 11 has a pair of sealed doors 31 and 131 to prevent particles from the non-clean, external environment from entering the process enclosure 11. Particles on the outside of the sealed doors 31 and 131 of the process enclosure and the transfer container 101 are trapped between the two doors 31 and 131 of the process enclosure 11 and the transfer container 101 when the transfer container 101 is locked in place on the shelf 311, compressing the various gaskets and seals 35, 37, and 135.

FIG. 6, including FIGS. 6A, 6B, and 6C, shows a perspective view of the transfer container, 101, used for transporting panels 100 to and between process enclosures 11 in clean room conditions. To be noted is that the transfer container 101 has a circumferential leading edge 105, encircling the airlock, and adapted for co-operating with a facing gasket 33 on the airlock transfer port 30 of the process enclosure 11, and compressing the gasket 33 to form an airtight seal therebetween.

Within the transfer container 101 and recessed from, non-coplanar with, and substantially parallel to the leading edge 105 of the transfer container 101 is an elastomeric, deformable ferromagnetic gasket 133 (i.e., a "ferromagnetic gasket"). The ferromagnetic gasket 133 is of the type typically used in freezers and refrigerators. The ferromagnetic gasket is adapted to receive and magnetically hold a ferromagnetic door 131 over the opening 103 in the front of the transfer container 101.

The sequence, FIGS. 6A, 6B, and 6C, illustrates an open interprocess transfer container 101, and the relationship of the ferromagnetic door 131 of the container 101 to the container 101. FIG. 6A shows the interprocess transfer container 101 with a ferromagnetic door 131 spaced therefrom.

FIG. 6B shows the ferromagnetic door panel 131 being pulled away from the interprocess transfer container 101, opening the front opening thereof.

FIG. 7, including FIGS. 7A, 7B, and 7C, shows a perspective view of the docking interface 301 of the process enclosure 11, and the sequence of steps to electromagnetically draw the ferromagnetic door 131 of the transfer container 101 away from the interprocess transfer container 101 and against the electromagnet 37 equipped door 31 of the process enclosure 11 at its docking interface 301, and then robotically open the magnetically coupled doors, 31 and 131 of the process enclosure 11 docking interface 301 and the interprocess transfer container 101.

FIG. 7A shows the process enclosure 11 port 301, with a pair of circumferential gaskets, 33 and 35, a sealable door, 31, and one or more electromagnets, 37. FIG. 7B shows the interprocess transfer container 101 in phantom, pressing against the process enclosure 11 port. The ferromagnetic door 131 of the interprocess transfer port 301 is shown partially broken away, with the electromagnet 37 and a portion of the inner circumferential gasket shown.

FIG. 7C shows the interprocess transfer container 101 and the process enclosure 11 port 301, with the ferromagnetic door 131 of the interprocess transfer container 11 and the electromagnetic door 31 of the process enclosure 11 partially drawn into the process enclosure 11 interlock. The open airlock provides the means for transferring panels between the transfer container 101 and the process enclosure 11.

To be noted is the inner gasket 35. This inner gasket 35 provides a seal between the major portion of the areas of each of the doors, 31 and 131, and the interior of the process enclosure 11. In this way the gasket 35 keeps surface dirt on the door surfaces from contaminating the localized clean room atmospheres of the process enclosure 11 and the interprocess transfer container 101.

FIG. 8 shows the opposite surface of the door 31 of the docking interface, 301, including the attachment point 81 for the robotic arm 63, and the electromagnets, 37.

FIG. 8 shows the interprocess transfer container 101 abutting the facing segment of the process enclosure 11, with interlock 301, with the outer gasket 33 of the interface dock 301 providing a compressive seal therebetween. This seal isolates the clean room atmospheres of the interprocess transfer container 101 and the process enclosure 11 from contaminated outside air. The inner gasket 35 between the two movable doors 31 and 131 is also shown.

The two doors 31 and 131 are initially in contact and both closed. Compressive means, as latch 211, shown in FIG. 4, are used to provide the compressive seals between the (1) the outer gasket 33 and the leading edge 105 of the interprocess transfer container 101, and (2)

the inner gasket 35 and the ferromagnetic door 131 of the interprocess transfer container 101. After the compressive seals are established, the electromagnet or electromagnets 37 are activated, to break the ferromagnetic and hermetic seals between the ferromagnetic gasket 133 and the ferromagnetic door 131 and magnetically clamp the doors, 31, 131, together. The robotic arm 63 then draws the process enclosure door 31, and the magnetically joined transfer container door 131, into the process enclosure 11. The robotic arm 63 carries the two doors 31 and 131 into the process enclosure 11 to provide an unobstructed channel for moving the panels 100 between the process enclosure 11 and the interprocess transfer container 101.

The numerical control means 51 for the robotic effector 63 and the electromagnets 37 properly sequences the the operation of opening the doors 31 and 131 to avoid contamination of the localized clean room environments, isolating surface contamination in the volume surrounded by the inner gasket 35 between the two doors 31 and 131.

FIG. 9, including FIGS. 9A 9B and 9C, shows a cutaway view, along cutting plane 9-9' of FIG. 6A, of the docking structure of the docking interface of the process enclosure and the transfer container.

FIG. 9A shows mating structures of the process enclosure 11 and the interprocess transfer container 101 as they are brought into sealable contact. Specifically to be noted are the gaskets 33 and 35, with the outer gasket 33 on the periphery of the process enclosure interlock 301 and the inner gasket 35 on the process enclosure 11 door 31. The ferromagnetic seal 133 is compressed by the ferromagnetic door 131 of the interprocess transfer container 101.

FIG. 9B shows the two surfaces in contact, with the outer gasket 33 providing a compressive seal between the facing walls 39 and 105 of the process enclosure 11 and the interprocess transfer container 101. The inner gasket 39 provides a compressive seal between the door 31 of the process enclosure 11 and the ferromagnetic door 131 of the interprocess transfer container 101, sealing outside contamination therebetween.

FIG. 9C shows the structure as the doors 31 and 131 begin to open. The seals 33 and 35 are still in place, that is, the outer gasket 33 continues to provide a compressive seal between the facing walls 39 and 105 of the process enclosure 11 and the interprocess transfer container 101 to keep outside contamination out of the clean room atmospheres. The inner gasket 35 continues to provide a compressive seal between the door 31 of the process enclosure 11 and the ferromagnetic door 131 of the interprocess transfer container 101, still sealing outside contamination between the two doors 31 and 131.

The door 31 of the process enclosure 11 is designed such that a robotic end effector 63 is used to mechanically and electromagnetically engage both of the doors. That is, one door, the process enclosure 11 door 31, is effected mechanically, and the other door, the interprocess transfer container 101 door 131 is effected electromagnetically. Preferably the robotic end effector 63 and its companion magnetic effector 37 engages both of the doors 31 and 131 simultaneously. The door assembly includes keying surfaces to prevent the doors from rotating relative to the end effector 63, as well as keys and pins to prevent the doors 31 and 131 from rotating with respect to one another or otherwise misaligning.

The electromagnetic end effector 37 shown in FIGS. 7 and 8 attracts and clamps the transfer container 101 door 131, clamping the enclosure door 31 to the transfer container 101 door 131, for example, by friction and magnetic force. The electromagnet 37 has sufficient magnetic force to pull the transfer container 101 door 131 away from the ferromagnetic gasket 133. In this way one pulling motion opens both doors, 31 and 131, simultaneously for storage of both doors 31, 131, inside the process enclosure 11.

Simultaneously opening both doors, 31 and 131, significantly reduces contaminant generation caused by the relative motion of one door part against the other door. A further advantage of opening both doors simultaneously is that particles on the outside of the transfer container door 131 and/or on the outside of the enclosure door 31 are trapped and safely contained between both doors 31 and 131 by the magnetically effected simultaneous opening of both doors.

Interprocess Transfer Container

The interprocess panel transfer container 101 provides clean room transfer of panels between pairs of process enclosures, 11, for example, adjacent process enclosures 11. The interprocess panel transfer container or transporter 101 is characterized by being substantially free of sources of particulate contamination, the minimum volume necessary for storing and handling cards and boards, and suitable airlocks for mating with facing airlocks 301, of the process enclosures 11a, 11b, and 11c.

In a particularly preferred embodiment of the invention the panel transfer container 101 is formed of unfilled polycarbonate. This is because fillers are a source of particulates. A further advantage of unfilled polycarbonates is that they are transparent. The use of transparent materials of construction for the panel transfer containers 101 makes the panel transfer containers 101 easier to align at the dockable interface 301. A further advantage of transparent materials of construction is that it is easier to to handle foils and thin panels inside the panel transfer container, especially during docking.

The transfer container 101 is a walled container having a facing pair of parallel side walls, 107 and 109, a facing pair of parallel end walls 111 and 113, a top, 115, and a bottom, 117, fabricated of a substantially particulate free material, such as unfilled, polycarbonate. One of the end walls is an access wall having an opening surrounded by a ferromagnetic gasket 133. This ferromagnetic gasket is adapted to receive a ferromagnetic door panel 131.

Each of said side walls 107 and 109 has at least one pair of co-planar bracket pairs 119, 119a. These bracket pairs 119, 119a hold the panels 100. The panels 100 are in the fixtures 171 described hereinabove.

At least one bracket 119a or 119b of each bracket pair has a pyramidal or conical positioning pin 121. The positioning pin 121 extends upwardly from the bracket 119 and is adapted to receive a workpiece bracket 171. A mating aperture 191 in the fixture 171 receives the positioning pin 121.

In a preferred embodiment both brackets 119 and 119a of a bracket pair have the pyramidal or conical positioning pins 171 extending upwardly and adapted to receive a workpiece fixture 171.

Process and Process Flow Chart

Various process and process sequences may be carried out using the system and method described herein. FIGS. 3 and 4 provide top and side views of the function of a robotic arm, for example, a SCARA robot 61, inside of the process enclosure. Workpieces, as printed circuit boards 100 or individual layers thereof are placed in fixtures, as shown in FIG. 5. These fixtures are then placed into sealable inter-process transfer containers 101 of the type shown in FIG. 6. The box is then purged with high quality, contaminant free gas, as 100K air, to provide an isolated storage environment of clean room quality.

At a later point, an operator selects a container 101 of panels 100 for processing. The container 101 is placed on the process enclosure 11 container shelf 311, in sealable relationship with the process enclosure 11. Sealable relationship is maintained by fasteners, clamps, or bolts 211 at the back of the transfer container 101. Guides in the shelf align the edges 105 of the interprocess transfer container 101 with the corresponding gasketed edges 33 of the process enclosure 11. The clamps 211 are then tightened to form the gas seal.

At this point the sequencing functions of the robot 61 are activated. For example, if a "retrieve workpieces" sequences is called, the first step is to activate an "door open" sequence. In this sequence robotic arm activates the door gripper end effector 81, and energizes the electromagnet 37 in the process enclosure door 31 to overcome the ferromagnet in the ferromagnetic gasket 133. Both doors are secured to the robotic arm end effector 71, the process enclosure door directly, and the transfer container door 131 magnetically, and removed in one motion.

The robotic arm then releases the door gripper end effector 71 and the doors 31, 131 in a resting position inside the process enclosure 11.

Next, the robotic arm takes an end effector 67 for gripping the in-process panel fixture 171, and removes a populated panel fixture 171 from the transfer container 101. The order in which panels are removed is programmed by the operator.

The fixtures 171 or the panel layers 100 themselves may have indicia, as part numbers, serial numbers, or the like. This may be optically coded, magnetically coded, or bar coded. The robotic arm may pass the fixture 171 over a decoder 65 to read the indicia. Using this indicia, the robotic end effector performs such functions as orienting the the fixture, if necessary, and passing the fixture to a tool load station, as a roll conveyor for wet processing, or to a work station for dry processing.

The inverse of the above sequence could then be used to unload the fixture 171 and its contained panel 100 from the process enclosure 11 back into the interprocess transfer container 101.

In another possible sequence of events the fixture gripper end effector 67 places the fixture 171 onto a vacuum chuck 68.

The vacuum is initiated, while the gripper end effector is replaced by, for example, a screw driver end effector 73. The screw driver end effector is used to remove the hold down or compressive fittings on the fixture 171. The top frame 179 of the fixture is then removed, for example by another end effector.

At this point the robotic arm may replace the screw driver or gripper end effector by a vacuum end effector 69. The vacuum chuck 68 vacuum is turned off and the vacuum end effector 69 vacuum is activated, allowing the robotic arm with the vacuum end effector to pick up the unfixtured panel 100.

The panel 100 is then moved past a decoder, as a bar code reader, and placed in a work station for unfixtured processing.

It is, of course, to be understood that the above sequence may be carried out in reverse sequence for placing the processed panel back into the fixture 171, and then into the transfer container 101.

Various panel fabrication processes and sequences may be carried out in the apparatus of the invention, using various methods of operation. For example, as shown in the flow chart of FIG. 10, solely by way of exemplification and illustration, and not limitation, in a subtractive circuitization process, panels with thin films of seed layer, copper, and photoresist, may be robotically taken from transporter 101, through a process enclosure 11, to a first process station 21a by robotic means 61. The panel is imaged in the first process station 21a, a dry process under clean room conditions, and robotically removed therefrom by robotic means 61 from the first process station, 21a, to and through the process enclosure 11, to a second process station, 21b.

The imaged photoresist is developed in the next process station, 21b, in a wet process under clean room conditions. The developed panel is then removed from the developing process station 21b under clean room conditions and robotically transported by robotic means 61 to and through the process enclosure 11 to an etching process station 21c for wet etching, also under clean room conditions. Finally, the etched panel is robotically removed from the process station 21c by robotic means 61, and delivered to a process station 21d for removal of the remaining photoresist.

All of these process have been carried out in individual, modular process stations, under clean room conditions, but without the necessity of a large clean room.

While the invention has been described with respect to certain preferred embodiments and exemplifications, it is not intended to limit the scope of the invention thereby, but by the claims appended hereto.

It is claimed:

1. An airlock transfer port between a process enclosure and an inter-process transfer container comprising:
   (1) facing sealable doors in the process enclosure and the transfer container, wherein:
      a. the sealable doors are in air sealable facing recesses of the process enclosure and the transfer container, with at least one first peripheral gasket surrounding the recesses and the pair of doors to provide a substantially clean room environment in the airlock,
      b. the sealable door in the process enclosure has controllable electromagnetic clamping means, and
      c. the sealable door in the interprocess transfer container is a ferromagnetic door comprising a ferromagnetic material;
   (2) a ferromagnetic gasket between the sealable, ferromagnetic door in the interprocess transfer container and the process enclosure to provide a magnetic seal therebetween;
   (3) means for activating the electromagnetic clamping means in the process enclosure door and attracting the ferromagnetic door in the interprocess transfer container away from the ferromagnetic gasket; and (4) means for simultaneously opening the process enclosure door and the ferromagnetic interprocess transfer container door.

2. The airlock transfer port of claim 1 comprising second peripheral gasket means to sealably isolate, between the doors and the first and second gasket means, surface contamination on either or both of the doors.

3. The airlock transfer port of claim 1 wherein the process enclosure door has an attachment point for a robotic arm, and the transfer port comprises robotic means to sequentially first activate the electromagnet and to thereafter open the magnetically clamped doors.

4. A manufacturing system comprising a plurality of isolated process enclosures, with movable interprocess transfer containers for transferring workpieces therebetween, said process enclosures and interprocess transfer containers having (1) recesses adapted to face each other in gasketable, air sealable relationship;

(2) sealable doors in the gasketable, air sealable recesses of the process enclosure and the transfer container, with at least one first peripheral gasket surrounding one of the recesses and doors to provide a sealed environment for forming temporary airlocks therebetween for transfer of workpieces, (3) controllable electromagnetic clamping means in the process enclosure door;

(4) ferromagnetic material in a sealable ferromagnetic interprocess container door of the interprocess transfer container;

(5) a ferromagnetic gasket between the sealable, ferromagnetic door in the interprocess transfer container and the process enclosure to provide a magnetic seal therebetween;

(6) means for activating the electromagnetic clamping means in the process enclosure door and attracting the sealable ferromagnetic door in the interprocess transfer container away from the ferromagnetic gasket; and (7) means for simultaneously opening the process enclosure door and the interprocess transfer container ferromagnetic door.

5. The manufacturing system of claim 4 comprising second peripheral gasket means to sealably isolate, between the doors and the second gasket means, surface contamination on either or both of the doors.

6. The manufacturing system of claim 1 wherein the process enclosure door has an attachment point for a robotic arm, and the process enclosure comprises robotic means to sequentially first activate the electromagnet and to thereafter open the magnetically clamped doors.

* * * * *